(12) United States Patent
Abe et al.

(10) Patent No.: US 6,564,451 B2
(45) Date of Patent: May 20, 2003

(54) HOLE FILLING METHOD FOR A PRINTED WIRING BOARD

(75) Inventors: Shigetoshi Abe, Tokorozawa (JP); Tomoko Kato, Chofu (JP); Yasuo Sato, Mitaka (JP); Takashi Itagaki, Oume (JP); Kenji Matsumoto, Mitaka (JP)

(73) Assignee: Japan Radio Co., Ltd., Mitaka (JP)

( * ) Notice: Subject to any disclaimer, the term of this patent is extended or adjusted under 35 U.S.C. 154(b) by 98 days.

(21) Appl. No.: 09/924,900

(22) Filed: Aug. 8, 2001

(65) Prior Publication Data

US 2002/0017739 A1 Feb. 14, 2002

(30) Foreign Application Priority Data

Aug. 9, 2000 (JP) ........................................ 2000-241252

(51) Int. Cl.$^7$ ................................................ H05K 3/36
(52) U.S. Cl. ............................ 29/830; 29/831; 29/852
(58) Field of Search ........................ 29/830, 823, 852, 29/840, 827, 831

(56) References Cited

U.S. PATENT DOCUMENTS

| | | | |
|---|---|---|---|
| 5,659,951 A | * | 8/1997 | Gall et al. |
| 5,876,842 A | * | 3/1999 | Duffy et al. |
| 6,175,087 B1 | * | 1/2001 | Keesler et al. |
| 6,300,575 B1 | * | 10/2001 | Appelt et al. |

FOREIGN PATENT DOCUMENTS

JP            5-167250        7/1993

* cited by examiner

Primary Examiner—Carl J. Arbes
(74) Attorney, Agent, or Firm—Collard & Roe, P.C.

(57) ABSTRACT

On carrying out a hole filling method for a printed wiring board having an interlayer connection hole, first and second printed wiring boards (1 and 2) are prepared, each of which has the interlayer connection hole. The first printed wiring board is placed on a bottom plate (7). On the first printed wiring board, a first hole guide plate (8) having a first guide hole formed at a position corresponding to the interlayer connection hole of the first printed wiring board is placed in such a manner that the first guide hole is coincident with the interlayer connection hole of the first printed wiring board. A hole filling resin (9) is superposed on the first hole guide plate. On the hole filling resin, a second hole guide plate (10) having a second guide hole formed at a position corresponding to the interlayer connection hole of the second printed wiring board is placed. On the second hole guide plate, the second printed wiring board is placed in such a manner that the interlayer connection hole of the second printed wiring board is coincident with the second guide hole of the second hole guide plate. A top plate (11) is placed on the second printed wiring board to form a stacked assembly which includes the first printed wiring board, the first hole guide plate, the hole filling resin, the second hole guide plate, and the second printed wiring board between the bottom plate and the top plate. The stacked assembly is vacuum-pressed between the bottom plate and the top plate to simultaneously fill the interlayer connection holes of the first and the second printed wiring boards with a part of the hole filling resin.

4 Claims, 4 Drawing Sheets

HOLE FILLING METHOD FOR A PRINTED WIRING BOARD

BACKGROUND OF THE INVENTION

This invention relates to a hole filling method for a printed wiring board used in an electronic apparatus.

Referring to FIGS. 1A through 1G, description will be made of a related hole filling method for a printed wiring board using a printing technique.

Referring to FIG. 1A, preparation is made of a printed wiring board 1 to be subjected to a hole filling process. The printed wiring board 1 comprises an insulator substrate 1a and a copper plating layer 1b. The insulator substrate 1a has through holes formed therein as desired. Then, the insulator substrate 1a is subjected to copper plating to form the copper plating layer 1b on both surfaces of the insulator substrate 1a and inside surfaces of the through holes. The copper plating layer 1b formed on the inside surface of each through hole in the insulator substrate 1a has an inner surface defining an interlayer connection hole (simply referred to as an interlayer connection hole throughout the specification) of the printed wiring board 1. The interlayer connection holes include a large-diameter through hole 3 having a diameter not smaller than the thickness of the printed wiring board 1 and a small-diameter through hole 4 having a diameter smaller than the thickness of the printed wiring board 1.

The printed wiring board 1 prepared as mentioned above is an interlayer connection plating printed wiring board. The hole filling process is carried out for each single interlayer connection plating printed wiring board.

Referring to FIG. 1B, the printed wiring board 1 is placed on a printing table 40 in order to carry out the hole filling process using the printing technique. A printing plate or pattern 50 is used to print a hole filling resin (for example, epoxy resin) 9 at desired positions. A squeegee 70 serves to apply the hole filling resin 9. After the printed wiring board 1 is placed on the printing table 40, the printing pattern 50 is put on the printed wiring board 1 and the hole filling resin 9 is applied and spread on the printing pattern 50 covering the printed wiring board 1 by the use of the squeegee 70.

Referring to FIG. 1C, the hole filling resin 9 is applied and spread on the printing pattern 50 by the squeegee 70 to be filled in the through holes 3 and 4 as filled resins 19 and 20, respectively. After the through holes 3 and 4 are filled with the hole filling resin 9, the printing pattern 50 is removed and the printed wiring board 1 is displaced from the printing table 40.

Referring to FIG. 1D, the printing pattern 50 is removed from the printed wiring board 1 and the printed wiring board 1 is displaced from the printing table 40. In this state, the hole filling resin 9 is cured. In FIG. 1D, a resin residue 100 is formed by a part of the hole filling resin 9 which has been present in an opening portion of the printing pattern 50 upon filling the hole filling resin 9 in the through holes 3 and 4 and is left on a resin insertion surface (upper surface in the figure) of the printed wiring board 1 or which leaks from the periphery of the opening portion of the printing pattern 50. The resin residue 100 also includes a part of the hole filling resin 9 leaking from a gap between the printing pattern 50 and the printed wiring board 1 in the vicinity of open ends of the through holes 3 and 4. The hole filling resin 9 is cured by heating or photocuring. At this time, both of the filled resins 19 and 20 filled in the through holes 3 and 4 and the resin residue 100 are cured together. As a result, protrusions are formed on the surface of the printed wiring board 1. Such protrusions must be removed by polishing or the like.

Referring to FIG. 1E, the surface of the printed wiring board 1 is flattened and smoothed by the use of a polisher 110. In order to remove the protrusions formed on the surface of the printed wiring board 1 due to presence of the resin residue 100 when the hole filling resin 9 is cured and to flatten and smooth the surface of the printed wiring board 1, polishing is carried out by the use of the polisher 110. At this time, the surface of the printed wiring board 1 is also shaved.

Referring to FIG. 1F, the protrusions are removed by polishing to produce flattened surfaces 120 and 130 of the hole filling resin 9 filled in the through holes 3 and 4 as the filled resins 19 and 20, respectively. In this state, the through holes 3 and 4 may be referred to as filled through holes.

Referring to FIG. 1G, the printed wiring board 1 with the filled through holes is obtained through the above-mentioned steps. In the illustrated state, the through holes 3 and 4 are filled with the hole filling resin 9 as the filled resins 19 and 20, respectively.

Next referring to FIGS. 2 and 3, description will be made of a merit achieved by filling the hole filling resin in the through holes formed in the printed wiring board 1.

Referring to FIG. 2, a component 32 is mounted on the printed wiring board 1 in which the through holes are not filled. Referring to FIG. 3, the component 32 is mounted on the printed wiring board 1 in which the through holes are filled.

In FIG. 2, the hole filling resin 9 is not filled in the through hole 3 as the filled resin 19. Therefore, a connection pad to connect the component 32 can not be formed on the through hole 3. On the other hand, in FIG. 3, the through hole 3 is filled with the hole filling resin 9 as the filled resin 19. Therefore, a pad 34 comprising a copper plating layer or the like can be formed on the filled resin 19 filled in the through hole 3 in such a manner that the pad 34 is connected to the copper plating layer 1b of the printed wiring board 1. Then, the component 32 can be mounted on the pad 34 located on the through hole 3.

As illustrated in FIG. 3, the pad 34 is formed on the through hole 3 buried with the filled resin 19 and the component 32 is directly connected to the pad 34 located on the through hole 3. In this manner, the wiring distance is shortened and the inductance is reduced as compared with FIG. 2. Thus, the impedance of the printed wiring board 1 is reduced.

However, in the related hole filling method described in conjunction with FIG. 1, the hole filling process must be carried out for each single printed wiring board 1. Therefore, the productivity is inferior.

In addition, the resin filling step and the resin curing step must separately be carried out. Therefore, the productivity is inferior.

Furthermore, the hole filling process must be followed by polishing to improve the flatness of the surface of the printed wiring board. Therefore, the productivity is inferior.

SUMMARY OF THE INVENTION

It is an object of this invention to provide a hole filling method for a printed wiring board, which is improved in productivity.

It is a specific object of this invention to provide a hole filling method for a printed wiring board, which is capable of simultaneously carrying out a hole filling process for two printed wiring boards.

It is another specific object of this invention to provide a hole filling method for a printed wiring board, which is capable of simultaneously carrying out a resin filling step and a resin curing step.

It is still another specific object of this invention to provide a hole filling method for a printed wiring board, which is capable of improving the flatness of the surface of the printed wiring board without requiring a polishing step after a hole filling process.

According to this invention, there is provided a hole filling method for a printed wiring board having an interlayer connection hole, comprising the steps of:

preparing first and second printed wiring boards each of which has the interlayer connection hole;

placing the first printed wiring board on a bottom plate;

placing on the first printed wiring board a first hole guide plate having a first guide hole formed at a position corresponding to the interlayer connection hole of the first printed wiring board in such a manner that the first guide hole is coincident with the interlayer connection hole of the first printed wiring board;

superposing a hole filling resin on the first hole guide plate;

placing on the hole filling resin a second hole guide plate having a second guide hole formed at a position corresponding to the interlayer connection hole of the second printed wiring board;

placing on the second hole guide plate the second printed wiring board in such a manner that the interlayer connection hole of the second printed wiring board is coincident with the second guide hole of the second hole guide plate;

placing a top plate on the second printed wiring board to form a stacked assembly which comprises the first printed wiring board, the first hole guide plate, the hole filling resin, the second hole guide plate, and the second printed wiring board between the bottom plate and the top plate; and vacuum-pressing the stacked assembly between the bottom plate and the top plate to simultaneously fill the interlayer connection holes of the first and the second printed wiring boards with a part of the hole filling resin.

Typically, each of the first and the second printed wiring boards comprises: an insulator substrate having a through hole (of any shape); and a metal film formed on a surface of the insulator substrate and on an inside surface of the through hole. The interlayer connection hole of each of the first and the second printed wiring boards is defined by an inner surface of the metal film formed on the inside surface of the through hole in each of the first and the second printed wiring boards.

Preferably, a thermosetting resin is used as the hole filling resin. The vacuum-pressing step is for vacuum-pressing the stacked assembly between the bottom plate and the top plate with the stacked assembly heated.

Thus, this invention is applicable to the printed wiring board on which a component is mounted on the interlayer connection hole after it is filled. A parting plate is placed as the bottom plate. On the parting plate, the printed wiring board with the interlayer connection hole not yet filled is placed. On the printed wiring board, the hole guide plate as a guide is placed. The hole filling resin is superposed on the hole guide plate. On the hole filling resin, the hole guide plate, the printed wiring board, and the parting plate as the top plate are similarly superposed to be symmetrical with those under the hole filling resin. The stacked assembly including the two printed wiring boards placed above and below are collectively subjected to heating and vacuum pressing. Thus, this invention provides the hole filling method using pressing with the hole guide plates, which is capable of carrying out the hole filling process simultaneously for the two printed wiring boards, which is capable of flattening a fracture surface of the hole filling resin after the hole filling process without forming the protrusions on the printed wiring board because the hole guide plate has a sealing effect of preventing leakage of the hole filling resin around the interlayer connection hole of the printed wiring board to be subjected to the hole filling process and the hole guide plate provides a function as a resin insertion guide hole, and which is free from limitation in relationship between the diameter of the interlayer connection hole to be filled and the thickness of the printed wiring board.

DESCRIPTION OF THE PREFERRED EMBODIMENT

Referring to FIGS. 4A through 4E, description will be made of a hole filling method using a hole guide plate according to this invention.

Figure 1A:
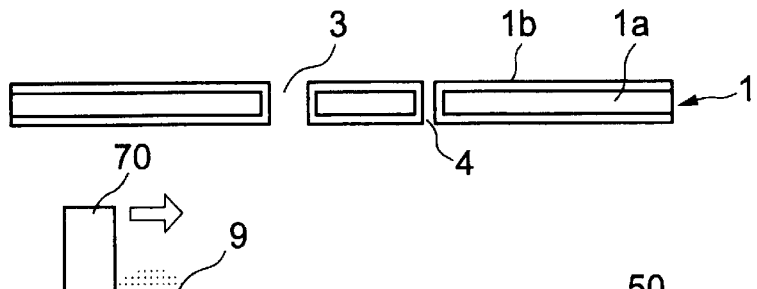
FIGS. 1A through 1G are views for describing a hole filling process carried out for an interlayer connection hole (through hole) by the use of a related technique.
Figure 1B:
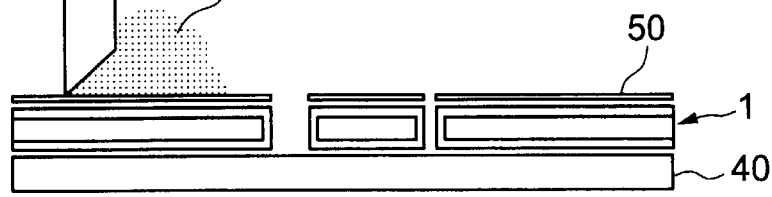
Figure 1C:
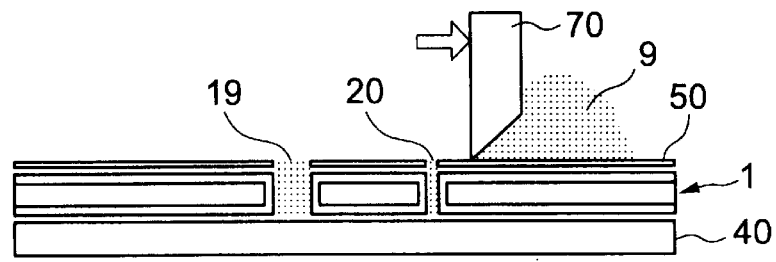
Figure 1D:
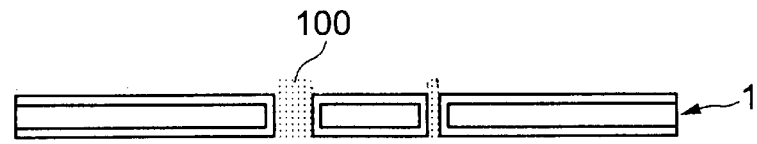
Figure 1E:
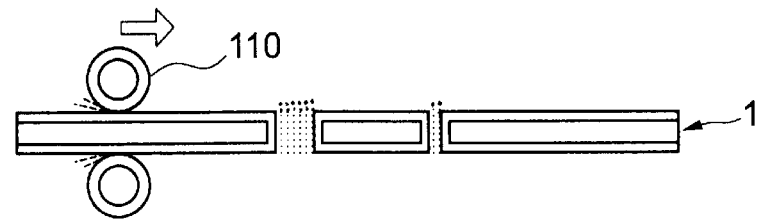
Figure 1F:
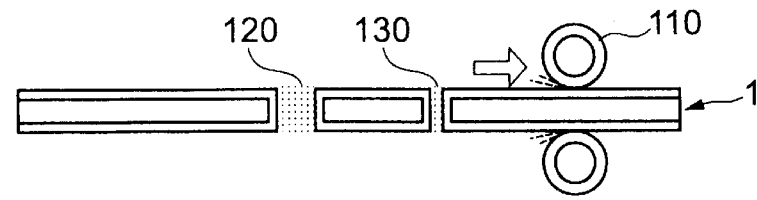
Figure 1G:
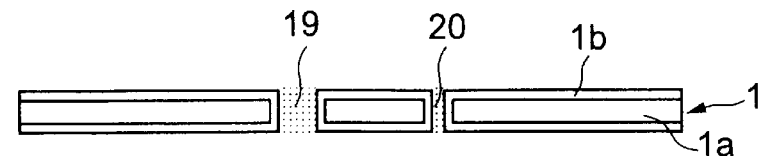
Figure 2:
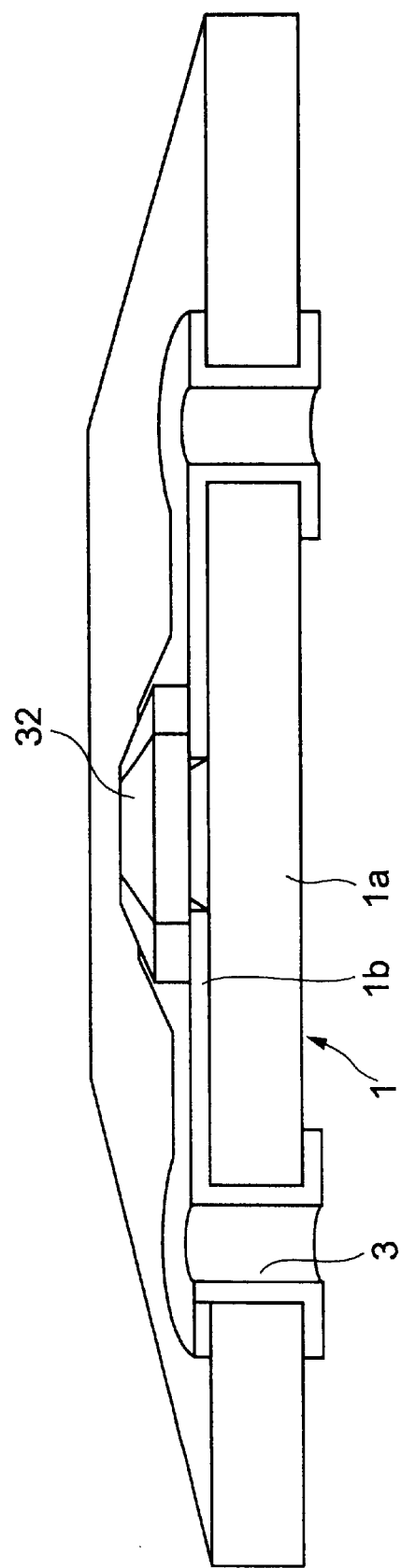
FIG. 2 is a perspective view of a printed wiring board and a component mounted thereon with an interlayer connection hole (through hole) left unfilled.
Figure 3:
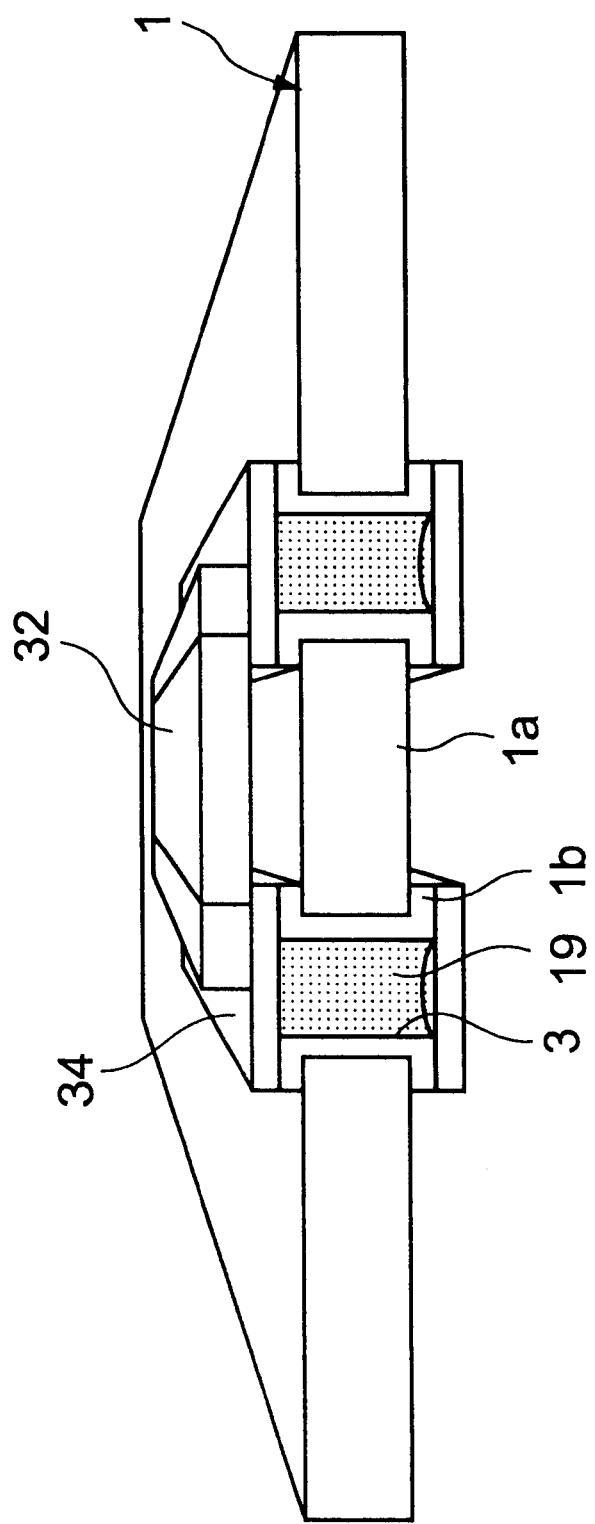
FIG. 3 is a perspective view of another printed wiring board and a component mounted thereon after an interlayer connection hole (through hole) is filled.
Figure 4A:
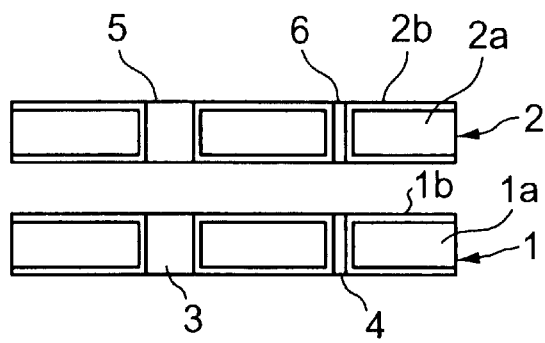
FIGS. 4A through 4E are views for describing a hole filling process carried out for an interlayer connection hole (through hole) according to this invention.

At first referring to FIG. 4A, preparation is made of first and second printed wiring boards 1 and 2 to be subjected to a hole filling process.

The first printed wiring board 1 comprises an insulator substrate 1a and a copper plating layer 1b. The insulator substrate 1a is subjected to drilling to form through holes as desired. Then, the insulator substrate 1a is subjected to copper plating to form the copper plating layer 1b on both surfaces of the insulator substrate 1a and inside surfaces of the through holes. The copper plating layer 1b formed on the inside surface of each through hole in the insulator substrate 1a has an inner surface defining an interlayer connection hole of the first printed wiring board 1. The interlayer connection holes include a large-diameter through hole 3 having a diameter not smaller than the thickness of the first printed wiring board 1 and a small-diameter through hole 4 having a diameter smaller than the thickness of the first printed wiring board 1.

Likewise, the second printed wiring board 2 comprises an insulator substrate 2a and a copper plating layer 2b. The insulator substrate 2a is subjected to drilling to form through holes as desired. Then, the insulator substrate 2a is subjected to copper plating to form the copper plating layer 2b on both surfaces of the insulator substrate 2a and inside surfaces of the through holes. The copper plating layer 2b formed on the inside surface of each through hole in the insulator substrate 2a has an inner surface defining an interlayer connection hole of the second printed wiring board 2. The interlayer connection holes include a large-diameter through hole 5 having a diameter not smaller than the thickness of the second printed wiring board 2 and a small-diameter through hole 6 having a diameter smaller than the thickness of the second printed wiring board 2.

Each of the first and the second printed wiring boards 1 and 2 is an interlayer connection plating printed wiring board. The first and the second printed wiring boards 1 and 2 are simultaneously subjected to a hole filling process in the following manner.

Figure 4B:
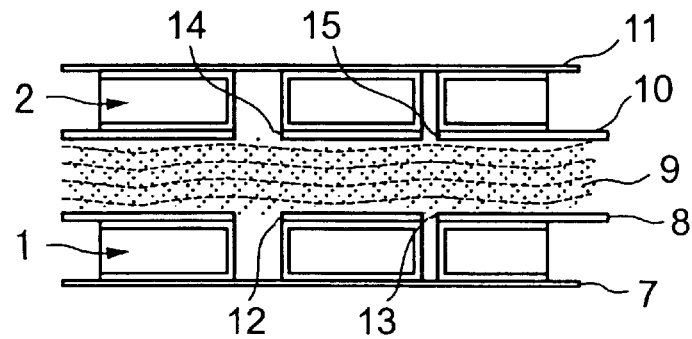

Referring to FIG. 4B, the first and the second printed wiring boards prepared in FIG. 4A are assembled into a state such that the hole filling process by vacuum pressing can be carried out.

First and second parting plates 7 and 11 are arranged as a bottom plate and a top plate on resin outflow surfaces of the first and the second printed wiring boards 1 and 2 upon carrying out the hole filling process, respectively. First and second hole guide plates 8 and 10 have, as guide holes 12, 13, 14, and 15 upon insertion of a hole filling resin 9, injection holes matching the through holes in the first and the second printed wiring boards 1 and 2. The hole filling resin 9 comprises, for example, an epoxy resin. The hole filling resin 9 is required to have a thermosetting property.

The guide holes 12 and 13 are formed in the first hole guide plate 8 so that the first hole guide plate 8 serves as a printing pattern to insert the hole filling resin 9 into the large-diameter through hole 3 and the small-diameter through hole 4. Likewise, the guide holes 14 and 15 are formed in the second hole guide plate 10 so that the second hole guide plate 10 serves as a printing pattern to insert the hole filling resin 9 into the large-diameter through hole 5 and the small-diameter through hole 6. As illustrated in FIG. 4B, the first parting plate 7, the first printed wiring board 1, and the first hole guide plate 8 are successively placed in this order from the bottom so that the through holes 3 and 4 of the first printed wiring board 1 are coincident in position with the guide holes 12 and 13, respectively. The second hole guide plate 10 is placed on the first hole guide plate 8 with the hole filling resin 9 interposed therebetween. On the second hole guide plate 10, the second printed wiring board 2 and the second parting plate 11 are placed so that the guide holes 14 and 15 of the second hole guide plate 10 are coincident in position with the through holes 5 and 6, respectively. Thus, the second hole guide plate 10, the second printed wiring board 2, and the second parting plate 11 are symmetrical with the first hole guide plate 8, the first printed wiring board 1, and the first parting plate 7. In the above-mentioned assembling, these plates and the boards are simply stacked one on another without using any substance having an adhesive effect.

Figure 4C:
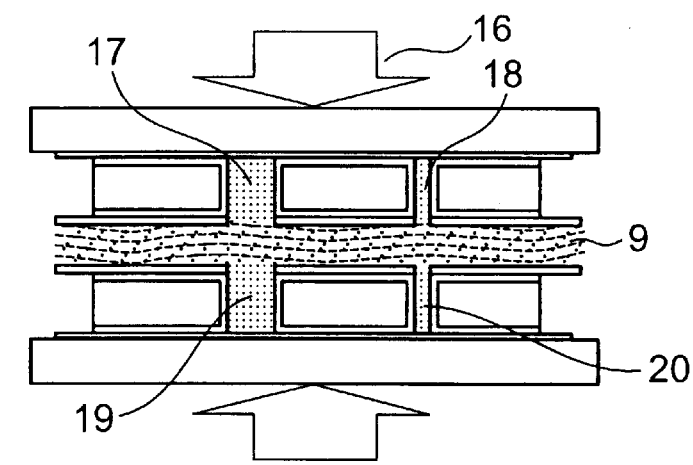

Next referring to FIG. 4C, a resultant assembly obtained as mentioned above is put into a press and the hole filling resin 9 is inserted into the through holes.

In FIG. 4C, the first and the second parting plates 7 and 11, the first and the second printed wiring boards 1 and 2, the first and the second hole guide plates 8 and 10, and the hole filling resin 9 assembled into a pressable state in FIG. 4B are subjected to vacuum pressing 16 and heating. By heating, the hole filling resin 9 is melted and therefore has flowability. Under the influence of the vacuum pressing, the hole filling resin 9 having flowability passes through the guide holes 12, 13, 14, and 15 of the first and the second hole guide plates 8 and 10 to be injected into the through holes 3, 4, 5, and 6 of the first and the second printed wiring boards 1 and 2.

At this time, the first and the second hole guide plates 8 and 10 serve to guide the hole filling resin 9 through the guide holes 12, 13, 14, and 15 into the through holes 3, 4, 5, and 6. By the vacuum pressing, the first and the second hole guide plates 8 and 10 are brought into tight contact with the surfaces of the first and the second printed wiring boards 1 and 2 so that a sealing effect is obtained. Therefore, the hole filling resin 9 is prevented from leaking and spreading to a resin insertion surface around the guide holes 12, 13, 14, and 15. Thus, the resin insertion surfaces of the first and the second printed wiring boards 1 and 2 are protected from the hole filling resin 9. The first and the second parting plates 7 and 11 serve to prevent the hole filling resin 9 from flowing out from the through holes 3, 4, 5, and 6 to protect the resin outflow surfaces of the first and the second printed wiring boards 1 and 2 from adhesion of the hole filling resin 9.

The hole filling resin 9 is sufficiently filled in the through holes 3, 4, 5, and 6 as filled resins 17, 18, 19, and 20 in FIG. 4C. By further vacuum pressing and heating, the hole filling resin 9 is cured. As a result of the vacuum pressing and heating mentioned above, the first and the second parting plates 7 and 11, the first and the second printed wiring boards 1 and 2, and the first and the second hole guide plates 8 and 10 assembled in FIG. 4B is rendered integral after the hole filling resin 9 is melted and then cured. A resultant integral assembly is removed from the press and the first and the second printed wiring boards 1 and 2 are separated.

Figure 4D:
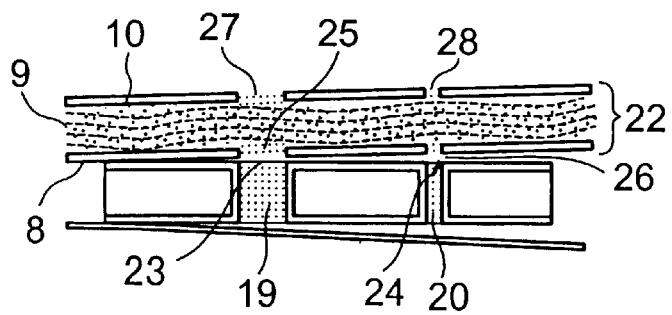

Referring to FIG. 4D, description will be made of separation of the first and the second parting plates 7 and 11, the first and the second printed wiring boards 1 and 2, the first and the second hole guide plates 8 and 10, and the cured hole filling resin 9 which are integral with one another after completion of the pressing.

After the hole filling resin 9 is sufficiently filled in the through holes, a remaining part of the hole filling resin 9 is cured between the first and the second hole guide plates 8 and 10 and secured to the first and the second hole guide plates 8 and 10 by pressing to form an integral plate structure 22.

The integral plate structure 22 including the first and the second hole guide plates 8 and 10 and the cured hole filling resin 9 is brought into tight contact with the surface of the first printed wiring board 1 (or the second printed wiring board 2) by pressing alone and, therefore, can easily be detached from the surface of the first printed wiring board 1 (or the second printed wiring board 2). The integral plate structure 22 is most strongly adhered to the first printed wiring board 1 (or the second printed wiring board 2) at junctions between the remaining part of the hole filling resin 9 and the filled resins 19 and 20 filled in the through holes 3 and 4 (or the filled resins 17 and 18 filled in the through holes 5 and 6).

When the integral plate structure 22 is detached, splitting of the cured hole filling resin 9 is started at the guide holes 12 and 13 of the first hole guide plate 8 (or the guide holes 14 and 15 of the second hole guide plate 10). Since the splitting is started at the guide holes 12 and 13 (or the guide holes 14 and 15), excessive resins 25 and 26 around the through holes 3 and 4 (or excessive resins 27 and 28 around the through holes 5 and 6) are held by the first hole guide plate 8 (or the second hole guide plate 10). Thus, resin fracture surfaces 23 and 24 at the through holes 3 and 4 are excellent in flatness with protrusions or residues of the resin suppressed. Likewise, resin fracture surfaces at the through holes 5 and 6 are excellent in flatness. The firs and the second parting plates 7 and 11 are brought into tight contact with the first and the second printed wiring boards 1 and 2 by pressing alone and can easily be detached.

Figure 4E:
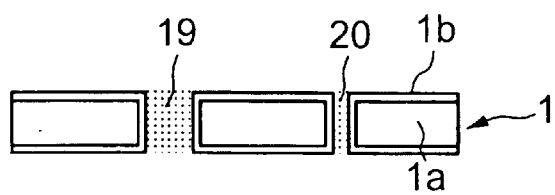

Referring to FIG. 4E, the first printed wiring board 1 with the filled through holes is obtained through the above-mentioned steps. The through holes 3 and 4 of the first printed wiring board 1 are filled with the hole filling resin 9 as the filled resins 19 and 20. Likewise, the second printed wiring board 1 with the filled through holes is obtained. The through holes 5 and 6 of the second printed wiring board 2 are filled with the hole filling resin 9 as the filled resins 17 and 18 (see FIG. 4C).

As described above, the two printed wiring boards can simultaneously subjected to the hole filling process. Thus, according to this invention, the productivity is improved.

Furthermore, according to this invention, the hole filling process is free from the influence of an aspect ratio between the diameter of the interlayer connection hole (through hole) to be filled and the thickness of the printed wiring board. Thus, hole filling ability is not restricted by the diameter of the interlayer connection hole (through hole) and the thickness of the printed wiring board.

According to this invention, the resin filling step and the resin curing step can be performed as a single step.

According to this invention, the hole guide plate has a sealing effect so that the hole filling resin is prevented from leaking or spreading or remaining on the surface of the board after the hole filling process. Thus, the flatness of the surface of the printed wiring board is improved.

As mentioned above, the flatness of the surface of the printed wiring board is improved so that no polishing step is required.

What is claimed is:

1. A hole filling method for a printed wiring board having an interlayer connection hole, comprising the steps of:

preparing first and second printed wiring boards each of which has the interlayer connection hole;

placing said first printed wiring board on a bottom plate;

placing on said first printed wiring board a first hole guide plate having a first guide hole formed at a position corresponding to the interlayer connection hole of said first printed wiring board in such a manner that said first guide hole is coincident with the interlayer connection hole of said first printed wiring board;

superposing a hole filling resin on said first hole guide plate;

placing on said hole filling resin a second hole guide plate having a second guide hole formed at a position corresponding to the interlayer connection hole of said second printed wiring board;

placing on said second hole guide plate said second printed wiring board in such a manner that the interlayer connection hole of said second printed wiring board is coincident with the second guide hole of said second hole guide plate;

placing a top plate on said second printed wiring board to form a stacked assembly which comprises said first printed wiring board, said first hole guide plate, said hole filling resin, said second hole guide plate, and said second printed wiring board between said bottom plate and said top plate; and vacuum-pressing said stacked assembly between said bottom plate and said top plate to simultaneously fill the interlayer connection holes of said first and said second printed wiring boards with a part of the hole filling resin.

2. A hole filling method for a printed wiring board having an interlayer connection hole, comprising the steps of:

preparing first and second printed wiring boards each of which has the interlayer connection hole;

placing said first printed wiring board on a bottom plate;

placing on said first printed wiring board a first hole guide plate having a first guide hole formed at a position corresponding to the interlayer connection hole of said first printed wiring board in such a manner that said first guide hole is coincident with the interlayer connection hole of said first printed wiring board;

superposing a hole filling resin on said first hole guide plate;

placing on said hole filling resin a second hole guide plate having a second guide hole formed at a position corresponding to the interlayer connection hole of said second printed wiring board;

placing on said second hole guide plate said second printed wiring board in such a manner that the interlayer connection hole of said second printed wiring board is coincident with the second guide hole of said second hole guide plate;

placing a top plate on said second printed wiring board to form a stacked assembly which comprises said first printed wiring board, said first hole guide plate, said hole filling resin, said second hole guide plate, and said second printed wiring board between said bottom plate and said top plate; and vacuum-pressing said stacked assembly between said bottom plate and said top plate to simultaneously fill the interlayer connection holes of said first and said second printed wiring boards with a part of the hole filling resin; wherein:

a thermosetting resin is used as said hole filling resin;

said vacuum-pressing step being for vacuum-pressing said stacked assembly between said bottom plate and said top plate with said stacked assembly heated.

3. A hole filling method for a printed wiring board having an interlayer connection hole, comprising the steps of:

preparing first and second printed wiring boards each of which has the interlayer connection hole;

placing said first printed wiring board on a bottom plate;

placing on said first printed wiring board a first hole guide plate having a first guide hole formed at a position corresponding to the interlayer connection hole of said first printed wiring board in such a manner that said first guide hole is coincident with the interlayer connection hole of said first printed wiring board;

superposing a hole filling resin on said first hole guide plate;

placing on said hole filling resin a second hole guide plate having a second guide hole formed at a position corresponding to the interlayer connection hole of said second printed wiring board;

placing on said second hole guide plate said second printed wiring board in such a manner that the interlayer connection hole of said second printed wiring board is coincident with the second guide hole of said second hole guide plate;

placing a top plate on said second printed wiring board to form a stacked assembly which comprises said first printed wiring board, said first hole guide plate, said hole filling resin, said second hole guide plate, and said second printed wiring board between said bottom plate and said top plate; and vacuum-pressing said stacked assembly between said bottom plate and said top plate to simultaneously fill the interlayer connection holes of said first and said second printed wiring boards with a part of the hole filling resin; wherein:

each of said first and said second printed wiring boards comprises: an insulator substrate having a through hole; and a metal film formed on a surface of said insulator substrate and on an inside surface of said through hole, said interlayer connection hole of each of said first and said second printed wiring boards being defined by an inner surface of said metal film formed on said inside surface of said through hole in each of said first and said second printed wiring boards.

4. A hole filling method for a printed wiring board having an interlayer connection hole, comprising the steps of:

preparing first and second printed wiring boards each of which has the interlayer connection hole;

placing said first printed wiring board on a bottom plate;

placing on said first printed wiring board a first hole guide plate having a first guide hole formed at a position corresponding to the interlayer connection hole of said first printed wiring board in such a manner that said first guide hole is coincident with the interlayer connection hole of said first printed wiring board;

superposing a hole filling resin on said first hole guide plate;

placing on said hole filling resin a second hole guide plate having a second guide hole formed at a position corresponding to the interlayer connection hole of said second printed wiring board;

placing on said second hole guide plate said second printed wiring board in such a manner that the interlayer connection hole of said second printed wiring board is coincident with the second guide hole of said second hole guide plate;

placing a top plate on said second printed wiring board to form a stacked assembly which comprises said first printed wiring board, said first hole guide plate, said hole filling resin, said second hole guide plate, and said second printed wiring board between said bottom plate and said top plate; and vacuum-pressing said stacked assembly between said bottom plate and said top plate to simultaneously fill the interlayer connection holes of said first and said second printed wiring boards with a part of the hole filling resin; wherein:

each of said first and said second printed wiring boards comprises: an insulator substrate having a through hole; and a metal film formed on a surface of said insulator substrate and on an inside surface of said through hole, said interlayer connection hole of each of said first and said second printed wiring boards being defined by an inner surface of said metal film formed on said inside surface of said through hole in each of said first and said second printed wiring boards;

a thermosetting resin being used as said hole filling resin;

said vacuum-pressing step being for vacuum-pressing said stacked assembly between said bottom plate and said top plate with said stacked assembly heated.

* * * * *